United States Patent
Hioka et al.

(10) Patent No.: US 10,263,177 B2
(45) Date of Patent: Apr. 16, 2019

(54) SEMICONDUCTOR DEVICE

(71) Applicant: SII Semiconductor Corporation, Chiba-shi, Chiba (JP)

(72) Inventors: Takaaki Hioka, Chiba (JP); Mika Ebihara, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/814,975

(22) Filed: Nov. 16, 2017

(65) Prior Publication Data

US 2018/0182955 A1 Jun. 28, 2018

(30) Foreign Application Priority Data

Dec. 28, 2016 (JP) ................................ 2016-255309

(51) Int. Cl.
| | | |
|---|---|---|
| H01L 43/00 | (2006.01) | |
| H01L 43/06 | (2006.01) | |
| H01L 43/04 | (2006.01) | |

(52) U.S. Cl.
CPC ............ *H01L 43/065* (2013.01); *H01L 43/04* (2013.01)

(58) Field of Classification Search
None
See application file for complete search history.

(56) References Cited

U.S. PATENT DOCUMENTS

| | | | | |
|---|---|---|---|---|
| 4,673,964 A | * | 6/1987 | Popovic | .................. H01L 27/22 257/426 |
| 4,929,993 A | | 5/1990 | Popovic | |
| 9,252,355 B2 | * | 2/2016 | Vanderhaegen | ...... H01L 43/065 |
| 9,543,504 B2 | * | 1/2017 | Schott | .................. H01L 43/065 |
| 2010/0123458 A1 | | 5/2010 | Schott | |
| 2010/0133632 A1 | * | 6/2010 | Schott | .................... G01R 33/07 257/427 |

FOREIGN PATENT DOCUMENTS

JP    S62-502927 A    11/1987

* cited by examiner

*Primary Examiner* — Hung Vu
(74) *Attorney, Agent, or Firm* — Brinks Gilson & Lione

(57) ABSTRACT

The vertical Hall element includes: a second conductivity type semiconductor layer formed on a first conductivity type semiconductor substrate; a plurality of high-concentration second conductivity type electrodes formed in a straight line on a surface of the semiconductor layer having substantially the same shape, and spaced at a first interval; a plurality of electrode isolation layers each formed between two electrodes out of the plurality of electrodes to isolate the plurality of electrodes from one another having substantially the same shape, and spaced at a second interval; and a first added layer and a second added layer each formed along the straight line outside of the outermost electrodes, and each having substantially the same structure as that of each electrode isolation layer.

18 Claims, 3 Drawing Sheets

SEMICONDUCTOR DEVICE

RELATED APPLICATIONS

This application claims priority under 35 U.S.C. § 119 to Japanese Patent Application No. 2016-255309 filed on Dec. 28, 2016, the entire content of which is hereby incorporated by reference.

BACKGROUND OF THE INVENTION

1. Field of the Invention

The present invention relates to a semiconductor device, in particular, to a semiconductor device having a vertical Hall element to detect a magnetic field in a horizontal direction.

2. Description of the Related Art

A Hall element is capable of detecting position or angle as a magnetic sensor without contacting to an object, and accordingly has various uses. Magnetic sensors that use a horizontal Hall element for detection of a magnetic field component perpendicular to a semiconductor substrate surface are particularly well known. There have been also proposed various magnetic sensors that use a vertical Hall element for detection of a magnetic field component parallel to a substrate surface.

One structure for a vertical Hall element is disclosed in, for example, Japanese Patent Publication No. S62-502927 in which a plurality of electrodes is aligned along a straight line.

In Japanese Patent Publication No. S62-502927, five electrodes formed from an N-type high concentration impurity region are aligned along a straight line, and a P-type electrode isolation diffusion layer is formed between every two electrodes and outside the leftmost electrode and the rightmost electrode. Further, the second electrode and the fourth electrode from an end are used as Hall voltage output electrodes whereas the electrode in the middle, the leftmost electrode, and the rightmost electrode are used as control current supply electrodes. A current is supplied from the middle control current supply electrode to the leftmost and rightmost control current supply electrodes to obtain a voltage difference generated between the Hall voltage output electrodes, which are the second and fourth electrodes from the end, as an output voltage, to thereby detect a magnetic field parallel to a substrate.

Hall elements are known to provide what is called an offset voltage as an output in the absence of a magnetic field. The offset voltage in general varies from element to element, and needs to be eliminated when a Hall element is used as a magnetic sensor. However, the offset voltage is not considered in Japanese Patent Publication No. S62-502927.

There is a method of eliminating the offset voltage by spinning current in a vertical Hall element that is structured so as to align a plurality of electrodes along a straight line as in Japanese Patent Publication No. S62-502927. The method is proposed in, for example, US 2010/0123458.

US 2010/0123458 achieves offset cancellation by configuring a plurality of electrodes aligned along a straight line so that each of the electrodes can be used as a control current supply electrode and a Hall voltage output electrode alternatingly, and switching the direction of current flow to switch the electrodes' roles as a control current supply electrode and a Hall voltage output electrode.

However, when offset cancellation by spinning current that is disclosed in US 2010/0123458 is executed in a vertical Hall element that has the device structure of Japanese Patent Publication No. S62-502927, the following phenomenon occurs.

Specifically, in Japanese Patent Publication No. S62-502927, the size (width) of the plurality of P-type electrode isolation diffusion layers formed between the electrodes and outside the leftmost and rightmost electrodes varies from one diffusion layer to another, whereas the same size and the same shape are shared by all of the plurality of electrodes. In a case where electrode isolation diffusion layers are not uniform as is the case here, when the location or direction of a current flow is changed by switching which electrodes are used as control current supply electrodes through spinning current, the shape of a current path varies depending on the location or direction of the current flow. In short, the variation in current path shape depending on the location or direction of a current flow means a loss of symmetry. The offset voltage cannot be eliminated completely as a result.

SUMMARY OF THE INVENTION

It is therefore an object of the present invention to provide a semiconductor device that includes a vertical Hall element capable of effectively removing an offset voltage.

According to one embodiment of the present invention, there is provided a semiconductor device comprising: a semiconductor substrate of a first conductivity type; and a vertical Hall element provided on the semiconductor substrate, the vertical Hall element comprising: a semiconductor layer of a second conductivity type formed on the semiconductor substrate; a plurality of electrodes formed along a straight line on a surface of the semiconductor layer, and are each formed from an impurity region of the second conductivity type having a concentration higher than that of the semiconductor layer, the plurality of electrodes having substantially the same shape and being spaced at a first interval; a plurality of electrode isolation layers each formed between two electrodes out of the plurality of electrodes on the surface of the semiconductor layer, to isolate the plurality of electrodes from one another, the plurality of electrode isolation layers having substantially the same shape and being spaced at a second interval; and a first added layer and a second added layer each formed along the straight line outside of outermost electrodes among the plurality of electrodes, the first added layer and the second added layer each having substantially the same structure as a structure of each of the plurality of electrode isolation layers, the first added layer being spaced apart by the second interval from one of the plurality of electrode isolation layers which is adjacent to one of the outermost electrodes, the second added layer being spaced apart by the second interval from another one of the plurality of electrode isolation layers which is adjacent to another of the outermost electrodes.

According to the present invention, one of a combination of an electrode isolation layer and another electrode isolation layer, and a combination of an electrode isolation layer and an added layer is placed on both sides of each of the plurality of electrodes, and the electrode isolation layers and the added layers all have substantially the same structure, which gives each electrode, including regions on both sides of the electrode, a similar configuration.

This configuration keeps the shapes of current paths substantially the same or symmetrical despite the switch of electrodes that are used as control current supply electrodes by spinning current, that is, despite a change of location where a current flows or a change of direction in which a current flows between the same two control current supply electrodes. The offset voltage can therefore be eliminated effectively by spinning current.

DETAILED DESCRIPTION OF THE PREFERRED EMBODIMENTS

Modes for carrying out the present invention are described in detail below with reference to the drawings.

Figure 1A:
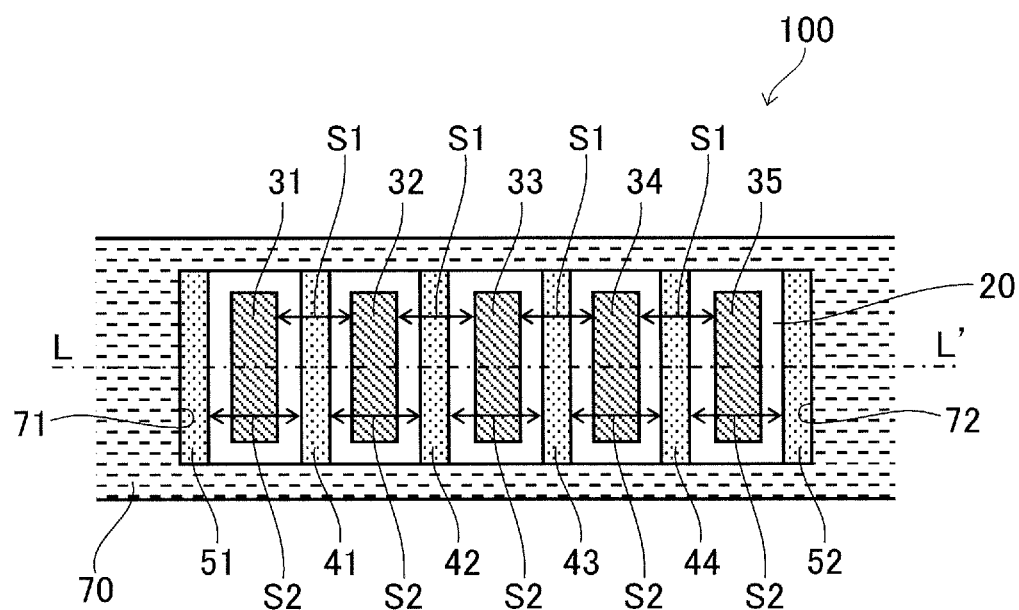
FIG. 1A is a plan view of a semiconductor device that includes a vertical Hall element according to a first example of a first embodiment of the present invention.
Figure 1B:
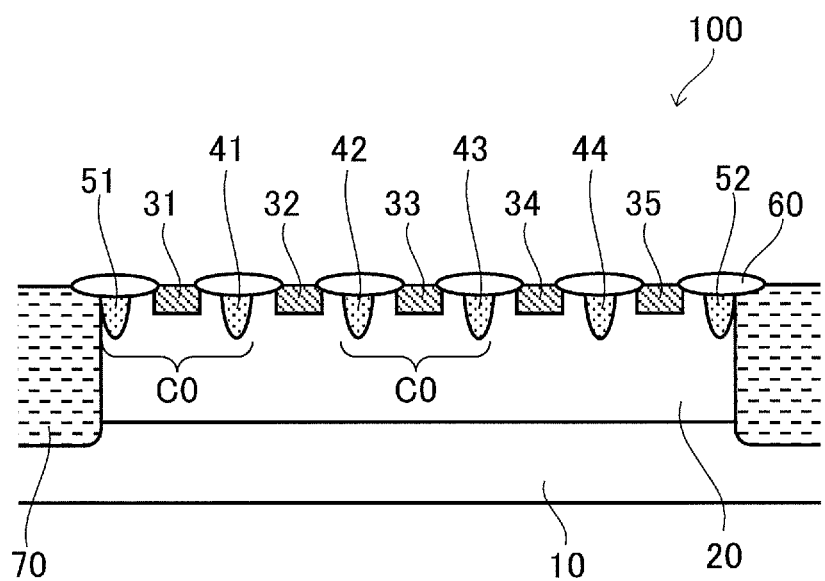
FIG. 1B is a sectional view taken along the line L-L' of FIG. 1A.

FIG. 1A and FIG. 1B are views for illustrating a semiconductor device having a vertical Hall element according to a first example of a first embodiment of the present invention. FIG. 1A is a plan view of the semiconductor device, and FIG. 1B is a sectional view taken along the line L-L' of FIG. 1A.

The semiconductor device of the first example of the first embodiment includes, as illustrated in FIG. 1A and FIG. 1B, a semiconductor substrate 10 of a P type which is a first conductivity type, a vertical Hall element 100 provided on the semiconductor substrate 10, and a P-type element isolation diffusion layer 70 formed so as to surround the perimeter of the vertical Hall element 100.

The vertical Hall element 100 includes a semiconductor layer 20 of an N type which is a second conductivity type, electrodes 31 to 35, electrode isolation layers 41 to 44, and added layers 51 and 52. The N-type semiconductor layer 20 is formed on the semiconductor substrate 10. The electrodes 31 to 35 are formed along a straight line on a surface of the N-type semiconductor layer 20, from an N-type impurity region higher in concentration than the N-type semiconductor layer 20. The electrode isolation layers 41 to 44 are formed on the surface of the N-type semiconductor layer 20 from a P-type diffusion layer. The added layers 51 and 52 are formed outside the leftmost electrode 31 and the rightmost electrode 35, respectively, from a P-type diffusion layer.

The electrodes 31 to 35 have substantially the same shape and are spaced at an interval S1.

The electrode isolation layers 41 to 44 are each formed between two electrodes out of the electrodes 31 to 35 to isolate the electrodes 31 to 35 from one another. The electrode isolation layers 41 to 44 have substantially the same shape and are spaced at an interval S2.

The added layers 51 and 52 are formed along the straight line described above, outside the outermost electrodes among the electrodes 31 to 35, namely, the electrode 31 and the electrode 35, and have substantially the same structure as that of the electrode isolation layers 41 to 44. The added layer 51 is spaced apart by the interval S2 from the electrode isolation layer 41 which is adjacent to the electrode 31. The added layer 52 is spaced apart by the interval S2 from the electrode isolation layer 44 which is adjacent to the electrode 35.

As described above, according to the first embodiment, each of the electrodes 31 to 35 is placed between an electrode isolation layer and another electrode isolation layer, or between an electrode isolation layer and an added layer. Since the electrode isolation layers and the added layers all have substantially the same structure, each of the electrodes 31 to 35 makes a similar structure in which the electrode is placed between electrode isolation layers or between an electrode isolation layer and an added layer, and which is denoted by C0 as shown in FIG. 1B.

This ensures that current paths have identicalness and symmetry in terms of shape when the direction or location of a current flow is changed by spinning current. The offset voltage can therefore be eliminated effectively by spinning current.

In the vertical Hall element 100 of the first example, there is no interval between the added layer 51 and an inner side surface 71 which is a surface of the element isolation diffusion layer 70 that is adjacent to the added layer 51, and between the added layer 52 and an inner side surface 72 which is a surface of the element isolation diffusion layer 70 that is adjacent to the added layer 52, in the running direction of the straight line along which the electrodes 31 to 35, the electrode isolation layers 41 to 44, and the added layers 51 and 52 are aligned. The added layer 51 and the inner side surface 71 are in contact with each other, and the added layer 52 and the inner side surface 72 are in contact with each other. In other words, the interval is zero between the added layer 51 and the inner side surface 71, and between the added layer 52 and the inner side surface 72.

Offset cancellation by spinning current can be effectively accomplished with this configuration while minimizing the increase in the size of the vertical Hall element 100.

In the first embodiment, an insulating film, for example, a $SiO_2$ film 60 is provided so as to cover the surface of the N-type semiconductor layer 20, except for regions in which the electrodes 31 to 35 are formed. This enables the semiconductor device to control a current flow parallel to the semiconductor substrate 10 on the surface of the N-type semiconductor layer 20.

The N-type semiconductor layer 20 is preferred to have an impurity concentration that is distributed uniformly in order to enhance magnetic sensitivity. The N-type semiconductor layer 20 that has a uniformly distributed impurity concentration can be formed by epitaxial growth. For enhanced magnetic sensitivity, the N-type semiconductor layer 20 is also preferred to be thicker, for example, 6 μm or more.

The element isolation diffusion layer 70 is formed so as to reach the P-type semiconductor substrate 10 in depth past the bottom of the N-type semiconductor layer 20. This electrically isolates the vertical Hall element 100 from other regions (not shown) on the semiconductor substrate 10. Elements provided in the other regions (not shown) on the semiconductor substrate 10 that are electrically isolated from the vertical Hall element 100 by the P-type element isolation diffusion layer 70 include a transistor that is a constituent of a circuit configured to process a signal output from the vertical Hall element 100, or a circuit configured to supply a signal to the vertical Hall element 100.

The electrode isolation layers 41 to 44 and the added layers 51 and 52 are formed by, for example, selectively diffusing P-type impurities in the N-type semiconductor layer 20.

The electrodes 31 to 35 are formed by, for example, covering the tops of the formed electrode isolation layers 41 to 44 and the formed added layers 51 and 52 with the SiO$_2$ film 60 that is formed through LOCOS, while leaving regions in which the electrodes 31 to 35 are to be formed, and then introducing N-type impurities with the SiO$_2$ film 60 used as a mask. The electrodes 31 to 35 are formed so as to have a depth equal to or less than the depth of the electrode isolation layers 41 to 44 and the added layers 51 and 52.

A method of eliminating the offset voltage by spinning current in the vertical Hall element 100 of the first embodiment is described below.

Referring to FIG. 1A and FIG. 1B, first, a current is caused to flow from the electrode 33 to the electrodes 31 and 35, with the electrodes 31, 33, and 35 as control current supply electrodes, to obtain a voltage between the electrode 32 and the electrode 34, which are Hall voltage output electrodes, as an output voltage Vout1. An output voltage Vout2 which is a voltage between the electrode 32 and the electrode 34 is also obtained by causing a current to flow in a reverse direction, namely, a direction from the electrodes 31 and 35 to the electrode 33.

The control current supply electrodes and the Hall voltage output electrodes are switched and a current is caused to flow from the electrode 32 to the electrode 34 to obtain a voltage between the electrode 33 and the electrodes 31 and 35 as an output voltage Vout3. An output voltage Vout4 which is a voltage between the electrode 33 and the electrodes 31 and 35 is also obtained by causing a current to flow in a reverse direction, namely, a direction from the electrode 34 to the electrode 32.

The offset voltage can be eliminated by adding or subtracting the output voltages Vout1 to Vout4.

In this manner, the offset voltage can be eliminated by spinning current that involves allowing a plurality of electrodes aligned along a straight line to be used as control current supply electrodes and Hall voltage output electrodes alternatingly, suitably switching the direction in which a current is caused to flow, and switching the roles of the control current supply electrodes and the Hall voltage output electrodes.

According to the first embodiment, despite a change in the location or the direction of a current flow that is caused by switching which electrodes are used as control current supply electrodes, the variation in current path shape depending on the location or direction of a current flow is prevented and current paths can consequently have substantially the same shape or symmetrical shapes.

Specifically, the presence of the added layers 51 and 52 ensures that the shapes of two current paths, for example, the path of a current flowing from the electrode 33 to the electrodes 31 and 35 and the path of a current flowing from the electrodes 31 and 35 to the electrode 33, are symmetrical, and that two current paths, for example, the path of a current flowing from the electrode 33 to the electrode 35 and the path of a current flowing from the electrode 32 to the electrode 34, have the same shape.

As described above, according to the first embodiment, a semiconductor device that includes a vertical Hall element capable of eliminating an offset voltage effectively by spinning current can be provided.

A configuration with which offset cancellation by spinning current is accomplished even more effectively in the first embodiment is described below as a second example of the first embodiment.

Figure 2A:
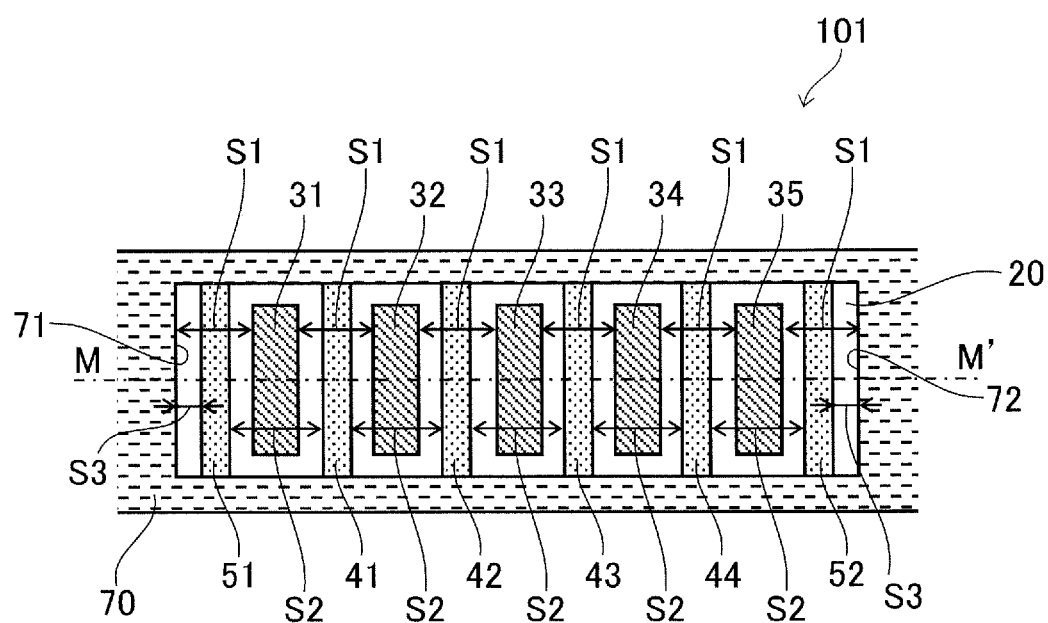
FIG. 2A is a plan view of a semiconductor device that includes a vertical Hall element according to a second example of the first embodiment of the present invention.
Figure 2B:
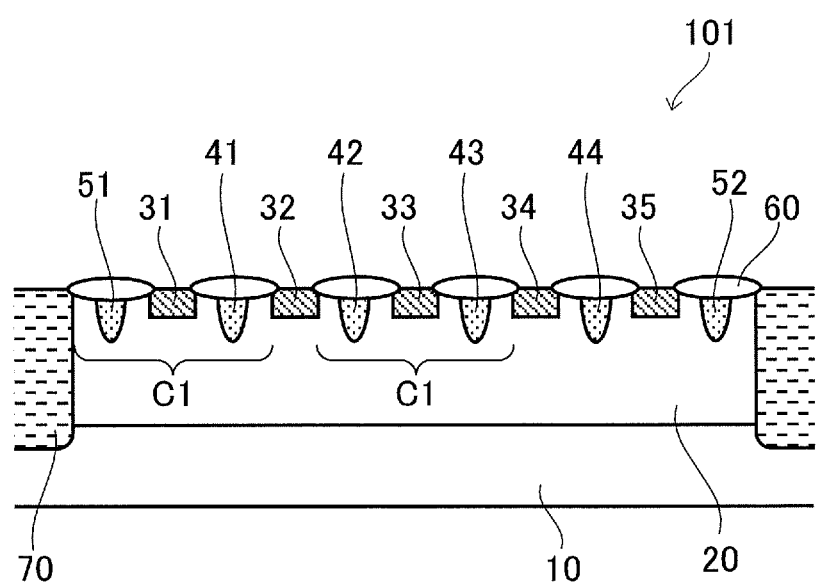
FIG. 2B is a sectional view taken along the line M-M' of FIG. 2A.

FIG. 2A is a plan view of a semiconductor device that includes a vertical Hall element according to the second example of the first embodiment of the present invention. FIG. 2B is a sectional view taken along the line M-M' of FIG. 2A. In FIG. 2A and FIG. 2B, components that are the same as those of the semiconductor device that includes the vertical Hall element 100 illustrated in FIG. 1A and FIG. 1B are denoted by the same reference symbols, and duplicate descriptions are omitted in places.

A vertical Hall element 101 illustrated in FIG. 2A and FIG. 2B differs from the vertical Hall element 100 illustrated in FIG. 1A and FIG. 1B in that an interval S3 is provided between the inner side surface 71 of the element isolation diffusion layer 70 and the added layer 51 and between the inner side surface 72 of the element isolation diffusion layer 70 and the added layer 52 in the running direction of the straight line along which the electrodes 31 to 35, the electrode isolation layers 41 to 44, and the added layers 51 and 52 are aligned.

The interval S3 in the second example is set so that an interval between the electrode 31 and the inner side surface 71 of the element isolation diffusion layer 70 and an interval between the electrode 35 and the inner side surface 72 of the element isolation diffusion layer 70 are each substantially the same as the interval S1 at which the electrodes 31 to 35 are spaced apart from one another.

Each of the electrodes 31 to 35 makes a similar structure in which the electrode is placed between electrode isolation layers as well as a semiconductor layer 20 extending to a side surface of the adjacent electrode on both sides, or placed between an electrode isolation layer and an added layer as well as a semiconductor layer 20 extending to a side surface of the adjacent electrode on one side and a semiconductor layer 20 extending to an inner side surface 71 or 72 of the element isolation diffusion layer 70 on the other side, and which is denoted by C1 as shown in FIG. 2B.

In other words, whereas the configuration C0 around the electrode 33 in the middle, for instance, of the vertical Hall element 100 that is illustrated in FIG. 1A and FIG. 1B is constructed from the electrode 33 and the electrode isolation layers 42 and 43 on both sides of the electrode 33, the configuration C1 of the vertical Hall element 101 that is illustrated in FIG. 2A and FIG. 2B further includes a part of the semiconductor layer 20 that is located between the electrode isolation layer 42 and the electrode 32 and a part of the semiconductor layer 20 that is located between the electrode isolation layer 43 on both sides of the configuration C0.

The configuration around the outermost electrodes 31 and 35 in which parts of the semiconductor layer 20 are included can thus become the same as the configuration C1 around each of the inner electrodes 32 to 34.

According to the vertical Hall element 101 of the second example, an interval equal to the distance between each electrode and its adjacent electrode isolation layer is thus set to a part of the semiconductor layer 20 that is located between the added layer 51 and the element isolation diffusion layer 70, and to a part of the semiconductor layer 20 that is located between the added layer 52 and the element isolation diffusion layer 70.

This configuration is employed because, when a current is caused to flow from the electrode 31 to the electrode 33, for example, some of current components may spread to a region of the semiconductor layer 20 past the electrode isolation layer 43. In other words, the semiconductor layer 20 is arranged so as to be present between the added layer 51 and the element isolation diffusion layer 70 as well in order to allow some of current components to spread to a region past the added layer 51 which has the same structure as that of each electrode isolation layer, when a current is caused to flow in a reverse direction, namely, a direction from the electrode 33 to the electrode 31. This ensures even more that current paths have symmetry and identicalness in terms of shape. The semiconductor layer 20 is arranged so as to be present between the added layer 52 and the element isolation diffusion layer 70 as well for a similar reason.

The thus configured vertical Hall element 101, although slightly larger in size than the vertical Hall element 100 of the first example, is improved even more in the symmetry and identicalness of current path shapes when the direction or location of a current flow is changed by spinning current.

It is therefore desirable to use the configuration of the vertical Hall element 101 of the second example when the precision of offset cancellation by spinning current falls short of a necessary level in the vertical Hall element 100 of the first example.

The interval S3 which, in the second example, is set so that the interval between the electrode 31 and the inner side surface 71 of the element isolation diffusion layer 70 is substantially the same as the interval S1 as described above, does not always need to be equal to the interval S1 and may be narrower than in the second example. This is because only very few current components of a current flowing, for example, from the electrode 31 to the electrode 33 are likely to spread to a region of the semiconductor layer 20 past the electrode isolation layer 43, and the precision of offset cancellation that is obtained when a narrow interval is set between the added layer 51 and the element isolation diffusion layer 70 and between the added layer 52 and the element isolation diffusion layer 70 is higher than the precision in the first example, where the interval is zero.

The interval S3 can also be set wider than in the second example without causing problems. However, a wider interval S3 means a larger size of the vertical Hall element 101, and the interval S3 of the second example is therefore preferred most.

A second embodiment of the present invention is described next.

Figure 3A:
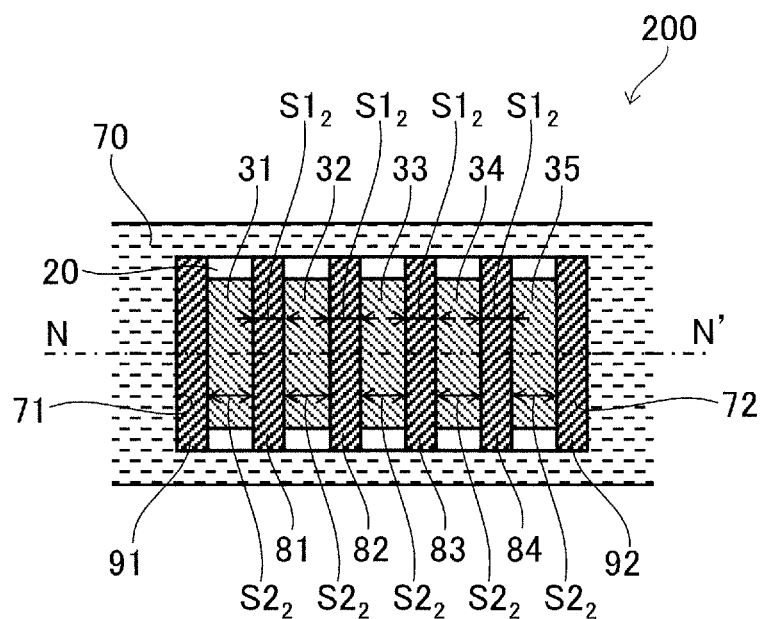
FIG. 3A is a plan view of a semiconductor device that includes a vertical Hall element according to a second embodiment of the present invention.
Figure 3B:
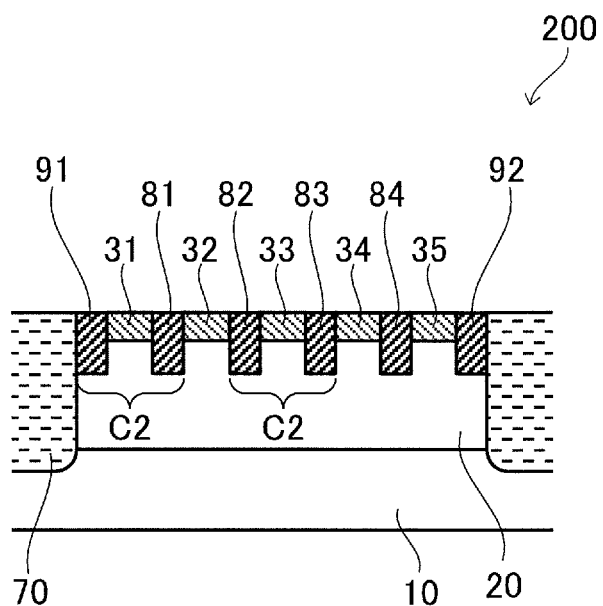
FIG. 3B is a sectional view taken along the line N-N' of FIG. 3A.

FIG. 3A is a plan view of a semiconductor device that includes a vertical Hall element according to the second embodiment of the present invention. FIG. 3B is a sectional view taken along the line N-N' of FIG. 3A. In FIG. 3A and FIG. 3B, components that are the same as those of the semiconductor device that includes the vertical Hall element 100 illustrated in FIG. 1A and FIG. 1B are denoted by the same reference symbols, and duplicate descriptions are omitted in places.

The semiconductor device according to the second embodiment includes a vertical Hall element 200 which is provided with insulating films embedded in trenches as electrode isolation layers 81 to 84 and as added layers 91 and 92, in place of a P-type diffusion layer in the first embodiment that serves as the electrode isolation layers 41 to 44 and as the added layers 51 and 52.

Specifically, the electrodes 31 to 35 are spaced at an interval S12 along a straight line, and the electrode isolation layers 81 to 84 are each formed between two electrodes out of the electrodes 31 to 35 to isolate the electrodes 31 to 35 from one another. The electrode isolation layers 81 to 84 have substantially the same shape and are spaced at an interval S22.

The added layers 91 and 92 are formed along the straight line described above, outside the outermost electrodes among the electrodes 31 to 35, namely, the electrode 31 and the electrode 35, and have substantially the same structure as that of the electrode isolation layers 81 to 84. The added layer 91 is spaced apart by the interval S22 from the electrode isolation layer 81 which is adjacent to the electrode 31. The added layer 92 is spaced apart by the interval S22 from the electrode isolation layer 84 which is adjacent to the electrode 35.

According to the second embodiment, each of the electrodes 31 to 35 is placed between an electrode isolation layer and another electrode isolation layer, or between an electrode isolation layer and an added layer as in the first embodiment. Since the electrode isolation layers and the added layers all have substantially the same structure, each of the electrodes 31 to 35 makes a similar structure in which the electrode is placed between electrode isolation layers or between an electrode isolation layer and an added layer, and which is denoted by C2 as shown in FIG. 3B.

This keeps the shapes of current paths substantially the same or symmetrical despite a change in the direction or location of a current flow that is caused by spinning current. The offset voltage can therefore be eliminated effectively by spinning current.

The electrode isolation layers 81 to 84 and the added layers 91 and 92 in the second embodiment are formed from insulating films embedded in trenches as described above. Consequently, no depletion layers are formed around the electrode isolation layers 81 to 84 and the added layers 91 and 92, thereby allowing the electrode isolation layers 81 to 84 and the added layers 91 and 92 to be in contact with the electrodes 31 to 35, instead of being spaced apart from the electrodes 31 to 35.

The vertical Hall element 200 of the second embodiment can therefore be made very small in size.

The electrode isolation layers 81 to 84 and the added layers 91 and 92 in the second embodiment are formed by, for example, forming on the N-type semiconductor layer 20 a mask that has openings in regions where trenches for the electrode isolation layers 81 to 84 and for the added layers 91 and 92 are to be formed, using the mask to form six trenches in the semiconductor layer 20, and embedding an insulating film ($SiO_2$ film, for example) in each of the trenches.

The electrodes 31 to 35 are formed by introducing N-type impurities to the entire surface after the electrode isolation layers 81 to 84 and the added layers 91 and 92 are formed. The electrodes 31 to 35 are formed so as to have a depth equal to or shallower than the depth of the electrode isolation layers 81 to 84 and the added layers 91 and 92.

The embodiments of the present invention have been described above, but the present invention is not limited to the above-mentioned embodiments, and it is to be understood that various modifications can be made thereto without departing from the gist of the present invention.

For instance, the first conductivity type and the second conductivity type, which are the P type and the N type, respectively, in the embodiments described above, may be switched so that the first conductivity is the N type while the second conductivity is the P type.

The N-type semiconductor layer 20 can be formed thick, for example, 6 μm or more, and does not always need to have an impurity concentration that is distributed uniformly, as long as a desired magnetic sensitivity is obtained. The N-type semiconductor layer 20 may be formed from an N well diffusion layer or a diffusion layer of other types.

A high concentration N-type embedded layer may be formed between the semiconductor substrate 10 and the N-type semiconductor layer 20. The N-type embedded layer in this case is formed on the semiconductor substrate 10 before the N-type semiconductor layer 20 is formed by epitaxial growth.

While five electrodes are used in the embodiments described above, the number of electrodes only needs to be high enough to ensure offset cancellation by spinning current, and it is sufficient if at least four electrodes are included.

What is claimed is:

1. A semiconductor device, comprising:
   a semiconductor substrate of a first conductivity type; and
   a vertical Hall element provided on the semiconductor substrate,
   the vertical Hall element comprising:
      a semiconductor layer of a second conductivity type formed on the semiconductor substrate;
      a plurality of electrodes formed along a straight line on a surface of the semiconductor layer, and each formed from an impurity region of the second conductivity type having a concentration higher than that of the semiconductor layer, the plurality of electrodes having substantially the same shape and being spaced at a first interval;
      a plurality of electrode isolation layers each formed between two electrodes out of the plurality of electrodes on the surface of the semiconductor layer, to isolate the plurality of electrodes from one another, the plurality of electrode isolation layers having substantially the same shape and being spaced at a second interval; and
      a first added layer and a second added layer each formed along the straight line outside of outermost electrodes among the plurality of electrodes, the first added layer and the second added layer each having substantially the same structure as a structure of each of the plurality of electrode isolation layers,
      the first added layer being spaced apart by the second interval from one of the plurality of electrode isolation layers which is adjacent to one of the outermost electrodes,
      the second added layer being spaced apart by the second interval from another one of the plurality of electrode isolation layers which is adjacent to another of the outermost electrodes.

2. The semiconductor device according to claim 1, further comprising an element isolation diffusion layer of the first conductivity type enclosing the vertical Hall element to electrically isolate the vertical Hall element from surroundings.

3. The semiconductor device according to claim 2, wherein, in a running direction of the straight line, substantially the same distance is set between the first added layer and a first inner side surface of the element isolation diffusion layer that is adjacent to the first added layer, and between the second added layer and a second inner side surface of the element isolation diffusion layer that is adjacent to the second added layer.

4. The semiconductor device according to claim 3, wherein an interval between one of the outermost electrodes and the first inner side surface of the element isolation diffusion layer and an interval between another of the outermost electrodes and the second inner side surface of the element isolation diffusion layer are each at least as large as the first interval.

5. The semiconductor device according to claim 4, wherein the plurality of electrode isolation layers, the first added layer, and the second added layer comprise diffusion layers of the first conductivity type.

6. The semiconductor device according to claim 5, wherein the surface of the semiconductor layer, a surface of the first added layer, and a surface of the second added layer are covered with an insulating film, except for regions in which the plurality of electrodes are formed.

7. The semiconductor device according to claim 4, wherein a number of the plurality of electrodes is at least four.

8. The semiconductor device according to claim 3, wherein the plurality of electrode isolation layers, the first added layer, and the second added layer comprise diffusion layers of the first conductivity type.

9. The semiconductor device according to claim 8, wherein the surface of the semiconductor layer, a surface of the first added layer, and a surface of the second added layer are covered with an insulating film, except for regions in which the plurality of electrodes are formed.

10. The semiconductor device according to claim 3, wherein a number of the plurality of electrodes is at least four.

11. The semiconductor device according to claim 2, wherein the plurality of electrode isolation layers, the first added layer, and the second added layer comprise diffusion layers of the first conductivity type.

12. The semiconductor device according to claim 11, wherein the surface of the semiconductor layer, a surface of the first added layer, and a surface of the second added layer are covered with an insulating film, except for regions in which the plurality of electrodes are formed.

13. The semiconductor device according to claim 2, wherein the plurality of electrode isolation layers, the first added layer, and the second added layer comprise insulating layers embedded in trenches.

14. The semiconductor device according to claim 2, wherein a number of the plurality of electrodes is at least four.

15. The semiconductor device according to claim 1, wherein the plurality of electrode isolation layers, the first added layer, and the second added layer comprise diffusion layers of the first conductivity type.

16. The semiconductor device according to claim 15, wherein the surface of the semiconductor layer, a surface of the first added layer, and a surface of the second added layer are covered with an insulating film, except for regions in which the plurality of electrodes are formed.

17. The semiconductor device according to claim 1, wherein the plurality of electrode isolation layers, the first added layer, and the second added layer comprise insulating layers embedded in trenches.

18. The semiconductor device according to claim 1, wherein a number of the plurality of electrodes is at least four.

* * * * *